(12) United States Patent
Ossmann et al.

(10) Patent No.: US 6,304,154 B1
(45) Date of Patent: Oct. 16, 2001

(54) CIRCUIT ARRANGEMENT INCLUDING A SELF-OSCILLATOR CIRCUIT

(75) Inventors: Martin Ossmann, Aachen; Dieter Leers, Stolberg, both of (DE)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/494,671

(22) Filed: Jan. 31, 2000

(30) Foreign Application Priority Data

Feb. 13, 1999 (DE) .............................. 199 06 109

(51) Int. Cl.[7] .................................................. H05B 41/02
(52) U.S. Cl. .................... 331/143; 331/146; 315/209 R; 315/224
(58) Field of Search .............................. 315/224, 209 R, 315/272; 331/143, 146, 150, 151, 107 R, 111, 108 C

(56) References Cited

U.S. PATENT DOCUMENTS

| | | | |
|---|---|---|---|
| 5,517,086 | * | 5/1996 | El-Hamamsy et al. ............... 315/247 |
| 5,559,394 | * | 9/1996 | Wood .................................. 315/224 |
| 5,657,926 | | 8/1997 | Kohji .................................. 239/102.2 |
| 5,719,471 | * | 2/1998 | Kachmarik ........................ 315/209 R |
| 5,925,985 | * | 7/1999 | Zeng et al. .......................... 315/224 |

* cited by examiner

*Primary Examiner*—Tuan T. Lam

(57) ABSTRACT

A circuit arrangement includes a self-oscillating oscillator circuit electrically connected with a series arrangement of a resistor arranged in series with a capacitor. The series arrangement determines the oscillation frequency of the oscillator circuit. The oscillator circuit serves to supply an oscillating supply voltage to an electronic device that exhibits a resonant frequency. A control signal output of the electronic device has a resistive coupling to the series arrangement. The control signal output serves to supply a control signal representative of the oscillation mode of the electronic device.

10 Claims, 1 Drawing Sheet

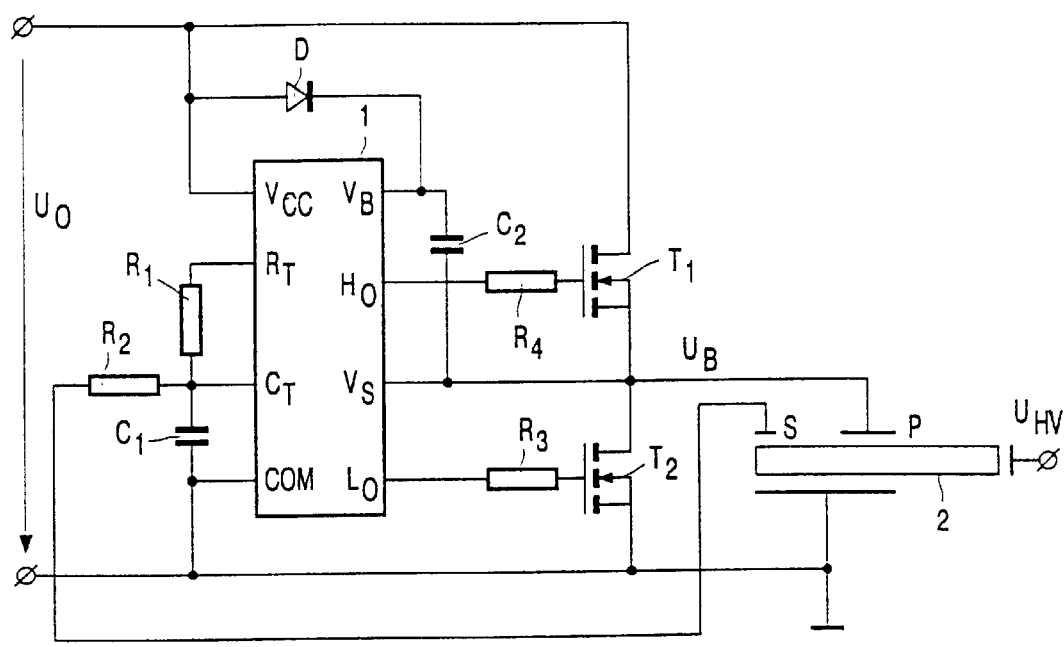

CIRCUIT ARRANGEMENT INCLUDING A SELF-OSCILLATOR CIRCUIT

The invention relates to a circuit arrangement including a self-oscillating oscillator circuit and a series arrangement of a resistor and a capacitor, which series arrangement determines the oscillation frequency of said oscillator circuit.

Such a circuit arrangement is known from International Rectifier Data Sheet No. PD60029A, 1994. The oscillator circuit in said arrangement is an integrated circuit which, in addition, includes further elements, particularly a half-bridge comprising two MOSFET transistors, in order to form a driver arrangement. The oscillator circuit has a first input connected to one terminal of the resistor of the series arrangement, a second input connected to the other terminal of the resistor and to the node of the series arrangement between the resistor and the capacitor, and a third input connected to the other terminal of the capacitor and a ground potential. An oscillating supply voltage is available on the output of the oscillator circuit.

This oscillating supply voltage is to be applied to an electronic device which has a resonant frequency and which can be a resonant electronic device or a resonant arrangement including a plurality of electronic devices. A problem which then arises is to adapt the oscillation frequency of the oscillator circuit as accurately as possible to the resonant frequency of the electronic device to be powered and to compensate for values of the devices used, which values lie within tolerance ranges. Moreover, it is then required to use a minimal number of circuit elements for this purpose.

These problems are solved in that a control signal output of the electronic device has a resistive coupling to the series arrangement, which control signal output serves to supply a control signal which is representative of the oscillation mode of the electronic device.

Owing to the feedback of the control signal via a resistive coupling the voltage values across the resistor and capacitor series arrangement which determines the oscillation frequency of the oscillator circuit are influenced directly, which is adequate in most cases in order to obtain a sufficiently accurate oscillation frequency. The previously used intricate compensation circuits for the compensation of device tolerances, particularly tolerances of the resistor-capacitor series arrangement and the electronic resonant structure, are then not needed any longer.

In a preferred embodiment the resistor of the series arrangement is coupled to a first and a second control input of the oscillator circuit and the capacitor of the series arrangement is coupled to the second control input and a ground input of the oscillator circuit, and the control signal output of the electronic device is connected to the node between the resistor and the capacitor of the series arrangement. This embodiment is particularly suitable when the afore-mentioned oscillator circuit in accordance with the International Rectifier Data Sheet No. PD60029A, 1994 is used. The electronic device is, for example, a piezoelectric transducer (?). Preferably, the circuit arrangement in accordance with the invention is used for the generation of an output voltage of a ballast circuit in a low-pressure discharge lamp.

An embodiment of the invention will now be described in more detail, by way of example, with reference to the FIGURE.

The FIGURE shows a circuit arrangement including a self-oscillating oscillator circuit 1 of the type IR 2155 (see, International Rectifier Data Sheet No. PD60029A, 1994), which receives a potential of a supply voltage $U_0$ at an input $V_{CC}$ and, via a diode D, at an input $V_B$. The input $V_B$ is connected to an output $V_S$ via a capacitor $C_2$, to which an oscillating supply voltage $U_B$ is delivered. The output $V_S$ is further connected to the node between two MOSFET transistors $T_1$ and $T_2$ arranged in series as a half-bridge. The series arrangement of the transistors $T_1$ and $T_2$ is situated between the potential of the supply voltage $U_0$ and a ground potential. The transistors $T_1$ and $T_2$ is are driven by the oscillator circuit 1 via resistors $R_4$ and $R_3$. The oscillation frequency of the oscillator circuit 1 is adapted to specific requirements by means of a series arrangement of a resistor $R_1$ and a capacitor $C_1$. One terminal of the resistor $R_1$ is connected to a first control input $R_T$ of the oscillator circuit 1. The other terminal of the resistor $R_1$ and one terminal of the capacitor $C_1$ are connected to a second control input $C_T$ of the oscillator circuit 1. The other terminal of the capacitor $C_1$ is at ground potential and is connected to a ground input of the oscillator circuit 1.

In the present embodiment the oscillating supply voltage $U_B$ appearing at the output $V_S$ is applied to an electronic device 2, which in the present case is a piezoelectric transducer consisting of a piezoelectric disc. The voltage $U_B$ is applied to an electrode P arranged on a flat surface of the piezoelectric disc, a corresponding electrode on the other flat surface of the piezoelectric disc being at ground potential. A high voltage $U_{HV}$ is available on an electrode at the circumferential surface of the piezoelectric disc. In a preferred example of use this voltage is used for the power supply in ballast circuits of low-pressure discharge lamps.

In order to guarantee an accurate tuning of the oscillation frequency of the oscillator circuit 1 to the resonant frequency of the piezoelectric transducer 2 and, particularly, to compensate for tolerances of the values of the resistor $R_1$ and of the capacitor $C_1$ a control signal, which is representative of the oscillation mode of the piezoelectric transducer 2, is taken from a control signal output S of the piezoelectric transducer and is fed to the series arrangement of the resistor $R_1$ and the capacitor $C_1$ via a resistive coupling represented as a resistor $R_2$. This simple feedback is sufficient to adapt the oscillation frequency of the oscillator circuit 1 to the resonant frequency of the piezoelectric transducer 2 and to compensate for tolerance errors.

What is claimed is:

1. A circuit arrangement including a self-oscillating oscillator circuit (1) electrically connected with a series arrangement of a resistor (R1) arranged in series with a capacitor (C1), which series arrangement determines the oscillation frequency of said oscillator circuit, characterized in that the oscillator circuit (1) serves to supply an oscillating supply voltage (UB) to an electronic device (2) which exhibits a resonant frequency, and a control signal output (S) of the electronic device (2) has a resistive coupling (R2) to the series arrangement, which control signal output serves to supply a control signal which is representative of the oscillation mode of the electronic device.

2. A circuit arrangement as claimed in claim 1, characterized in that the resistor ($R_1$) of the series arrangement is coupled to a first and a second control input ($R_T$, $C_T$) of the oscillator circuit (1) and the capacitor ($C_1$) of the series arrangement is coupled to the second control input ($C_T$) and a ground input of the oscillator circuit (COM), and the control signal output of the electronic device (2) is connected to the node between the resistor ($R_1$) and the capacitor ($C_1$) of the series arrangement.

3. A circuit arrangement as claimed in claim 1, characterized in that the electronic device (2) is a piezoelectric transducer.

4. A use of the circuit arrangement as claimed in claim 1 for the generation of an output voltage of a ballast circuit in a low-pressure discharge lamp.

5. A use of the circuit arrangement as claimed in claim 3 for the generation of an output voltage of a ballast circuit in a low-pressure discharge lamp.

6. A use of the circuit arrangement as claimed in claim 2 for the generation of an output voltage of a ballast circuit in a low-pressure discharge lamp.

7. A circuit arrangement comprising:
- a self-oscillating oscillator circuit that supplies an oscillating supply voltage;
- a series arrangement electrically connected with the oscillator circuit, the series arrangement determining oscillation frequency of the oscillator circuit and including a resistor arranged in series with a capacitor, the resistor being coupled to first and second control inputs of the oscillator circuit, the capacitor being coupled to the second control input and a ground input of the oscillator circuit; and
- a piezoelectric transducer that receives the supply voltage from the oscillator circuit, the piezoelectric transducer having a resonant frequency and including a control signal output that has a resistive coupling to the series arrangement and serves to supply a control signal representative of oscillation mode of the piezoelectric transducer.

8. The circuit arrangement of claim 7, wherein the control signal output of the electronic device is connected to a node between the resistor and the capacitor of the series arrangement.

9. A use of the circuit arrangement as claimed in claim 8 for the generation of an output voltage of a ballast circuit in a low-pressure discharge lamp.

10. A use of the circuit arrangement as claimed in claim 7 for the generation of an output voltage of a ballast circuit in a low-pressure discharge lamp.

\* \* \* \* \*